United States Patent
Matsuda et al.

(10) Patent No.: US 7,215,235 B2
(45) Date of Patent: May 8, 2007

(54) CONDUCTIVE SUBSTRATE WITH RESISTANCE LAYER, RESISTANCE BOARD, AND RESISTANCE CIRCUIT BOARD

(75) Inventors: Akira Matsuda, Tochigi-ken (JP); Yuuji Suzuki, Tochigi-ken (JP); Hideo Otsuka, Tochigi-ken (JP); Yuuki Kikuchi, Tochigi-ken (JP); Sadao Matsumoto, Tochigi-ken (JP)

(73) Assignee: Furukawa Circuit Foil Co., Ltd, Tokyo (JP)

(*) Notice: Subject to any disclaimer, the term of this patent is extended or adjusted under 35 U.S.C. 154(b) by 0 days.

(21) Appl. No.: 10/819,929

(22) Filed: Apr. 8, 2004

(65) Prior Publication Data

US 2004/0201446 A1    Oct. 14, 2004

(30) Foreign Application Priority Data

Apr. 11, 2003 (JP) ............................. 2003-107519

(51) Int. Cl.
*H01C 1/012* (2006.01)

(52) U.S. Cl. ..................... 338/308; 427/102; 338/328

(58) Field of Classification Search ............... 427/103, 427/102, 160; 338/307, 308, 309, 324, 328, 338/22 R See application file for complete search history.

(56) References Cited

U.S. PATENT DOCUMENTS

| | | | |
|---|---|---|---|
| 3,287,161 A * | 11/1966 | Schwertz et al. ........... 427/102 |
| 3,691,007 A | 9/1972 | Pavlou | |
| 3,743,583 A | 7/1973 | Castonguay | |
| 3,808,576 A | 4/1974 | Castonguay | |
| 3,857,683 A | 12/1974 | Castonguay | |
| 3,878,003 A | 4/1975 | Lo Presti et al. | |
| 4,808,967 A | 2/1989 | Rice et al. | |
| 4,888,574 A | 12/1989 | Rice et al. | |
| 4,892,776 A | 1/1990 | Rice et al. | |
| 5,243,320 A * | 9/1993 | Clouser et al. ............. 338/308 |
| 5,336,391 A | 8/1994 | Rice et al. | |
| 5,689,227 A | 11/1997 | Nguyen et al. | |
| 5,955,936 A * | 9/1999 | Shaw et al. ................. 338/328 |
| 6,329,899 B1 * | 12/2001 | Hunt et al. ................. 338/308 |
| 6,396,387 B1 * | 5/2002 | Hunt et al. ................. 338/308 |
| 6,411,194 B2 * | 6/2002 | Shindoh et al. ............. 338/308 |
| 6,522,237 B1 * | 2/2003 | Ito et al. .................... 338/22 R |

(Continued)

FOREIGN PATENT DOCUMENTS

JP    48-73762    10/1973

(Continued)

*Primary Examiner*—Tu Hoang
(74) *Attorney, Agent, or Firm*—Birch, Stewart, Kolasch & Birch, LLP

(57) ABSTRACT

A conductive substrate with a resistance layer comprising a substantially flat high conductivity substrate roughening treated on its surface by a resistance component and provided with a resistance layer by the resistance component so as to enable the interface between the high conductivity substrate and resistance component layer to be substantially flattened, enable acquisition of a thin film resistance layer with a stable resistance after dissolving away the high conductivity substrate, and able to maintain the peel strength with the insulating support, and a resistance board using the same.

10 Claims, 1 Drawing Sheet

U.S. PATENT DOCUMENTS

| | | | |
|---|---|---|---|
| 6,570,483 B1 * | 5/2003 | Chandler et al. | 338/328 |
| 6,622,374 B1 * | 9/2003 | Wang et al. | 29/620 |
| 6,965,293 B2 * | 11/2005 | Choi et al. | 338/22 R |
| 2001/0026211 A1 * | 10/2001 | Shindoh et al. | 338/308 |
| 2003/0016118 A1 * | 1/2003 | Schemenaur et al. | 338/309 |
| 2003/0048172 A1 * | 3/2003 | Meigs et al. | 338/308 |
| 2003/0231099 A1 * | 12/2003 | Schemenaur et al. | 338/308 |

FOREIGN PATENT DOCUMENTS

| | | |
|---|---|---|
| JP | 54-72468 | 6/1979 |
| JP | 63-500133 | 1/1988 |

* cited by examiner

CONDUCTIVE SUBSTRATE WITH RESISTANCE LAYER, RESISTANCE BOARD, AND RESISTANCE CIRCUIT BOARD

This Nonprovisional application claims priority under 35 U.S.C. § 119(a) on Patent Application No(s). 2003-107519 filed in JAPAN on Apr. 11, 2003, the entire contents of which are hereby incorporated by reference.

BACKGROUND OF THE INVENTION

1. Field of the Invention

The present invention relates to a conductive substrate with a resistance layer useful for the production of a resistance circuit board and to a resistance board using that conductive substrate with a resistance layer, more particularly relates to a conductive substrate with a resistance layer and a resistance board capable of maintaining the uniformity of the resistance layer in a step of etching away a high conductivity substrate of the conductive substrate with a resistance layer so as to leave the resistance layer on an insulating board.

2. Description of the Related Art

A printed circuit board material embedding resistors (hereinafter called a "resistance circuit board material") is generally provided in the form of a multilayer body of an insulating board and a resistance layer adhered to that board and copper foil or other high conductivity bases adhered to that resistance layer.

A printed resistance circuit using a resistance circuit board material is produced by the subtractive method (mask etching method) giving insulating regions where all of the resistance layer and conductive base on the insulating board are removed, resistance regions where the high conductive base is removed, and all remaining conductive regions in accordance with the targeted pattern of the circuit.

In the past, as the material forming the resistance layer, a carbon-based resistance material was generally used. As other methods using metal thin films, electroplated nickel including phosphorus (Japanese Patent Publication (A) No. 48-73762 and Japanese National Publication No. 63-500133), electroplated nickel including tin (Japanese Patent Publication (A) No. 54-72468), etc. have been proposed. With these types of metal thin resistance layers, however, while it is possible to obtain a film with a high sheet resistance by reducing the thickness, in general, if the thickness is reduced, the uniformity of the metal film is lost and a constant sheet resistance cannot be obtained, so there are limits to the reduction of thickness.

That is, in the production of a conductive base with a resistance layer, a thin resistance layer is formed on a conductive base by electroplating, but to raise the bonding strength of the conductive base with a resistance layer to the insulating substrate, the surface of the conductive base is roughened, then is plated with the Ni—P etc. serving as resistance layer. With this method, however, since the resistance layer is present on the rough surface of the conductive base, in particular on the finely roughened surface by fine particles, even right after plating, the uniformity of thickness of the plating is poor and the sheet resistance lacks stability.

Further, dissolution of part of the resistance layer cannot be avoided since the layer of the conductive base is etched away when used as a resistance circuit board material. Further, if there is unevenness in thickness in the Ni—P plated resistance layer, there is the defect that part of the resistance layer is also etched out in order to completely remove the layer of the conductive base. It was extremely difficult to stably leave resistors and produce a printed resistance circuit board. In particular, when roughening treating with copper etc., then plating a resistance layer, the cross-section exhibited knobbed relief shapes due to the roughening with copper and it was difficult to dissolve away all of the copper layer without dissolving the resistance layer. If sufficiently removing the roughening treating layer, the resistance layer was inevitably dissolved and therefore obtaining a stable resistance value was not possible. Further, when producing a multilayer printed resistance circuit board, the printed resistance circuit board is hot pressed. There are therefore the defects that at this time, cracks occur at the portion of only the resistance layer (parts where conductive base is etched away), the resistance increases, or sometimes the circuit becomes open.

In forming a resistance layer by such Ni—P alloy plating, nickel ions, phosphorous acid ions, and phosphoric acid ions are essential. A plating bath for forming the resistance layer also includes sulfuric acid ions and chlorine ions. A conductive base with a resistance layer obtained by plating on a conductive base by using such a bath suffers from ununiform color at the time of plating and variations in the plating layer microscopically. In a wide material used at the time of mass production (for example, having a width greater than 300 mm), variation easily occurs in the plating thickness and phosphorus content in the width direction and the fluctuation in resistance of the resistance circuit becomes greater.

In the case of a resistance layer made of a Ni—Sn alloy, tin oxides or hydroxides remain on the insulating board when the resistance layer is etched to form insulation regions (dissolving the Ni—Sn) and the problem of poor insulation arises. Further, Ni—Cr, Ni—Cr—Al—Si, etc. formed by vapor deposition have been developed for the same purposes, but problems of cost and productivity and also problems of a low bonding strength with the insulating material have been pointed out.

SUMMARY OF THE INVENTION

An object of the present invention is to provide a conductive substrate with a resistance layer comprised of a substantially flat high conductivity substrate roughening treated on its surface by resistance components and provided with a resistance layer by the resistance components so as to enable the interface between the high conductivity substrate and the resistance component layers (roughening treating layer and resistance layer) to be made substantially flat, dissolving away the high conductivity substrate in a manner so as to form a stable thin resistance layer without the occurrence of incomplete dissolution of the high conductivity substrate and without the danger of the resistance layer being broken even with slight over etching to prevent this by having the dissolution stop at the roughening treating layer, and able to maintain the peel strength with the insulating support.

A further object of the present invention is to provide a resistance board using that conductive substrate with a resistance layer.

A still further object of the present invention is to provide a resistance circuit board fabricated from that resistance board.

According to a first aspect of the invention, to achieve the first object, there is provided a conductive substrate with a resistance layer comprising a high conductivity substrate on the surface of which a roughening treating layer by resistance components is provided and over the roughening treating layer of which a resistance layer is provided.

Preferably, the high conductivity substrate is an electrodeposited copper foil, electrodeposited copper alloy foil, rolled copper foil, or rolled copper alloy foil. Note that the electrodeposited copper foil and rolled copper foil may contain trace amounts of silver, phosphorus, and other alloy components.

The resistance layer may be formed by plating nickel, cobalt, chromium, or an alloy including the same by electroplating, electroless plating, vapor deposition, or another dry generation process. In particular, a nickel or cobalt alloy containing phosphorus is desirable.

Preferably, the roughening treating layer can be removed by an etching solution the same as that of the resistance layer. Preferably, it is formed by nickel, cobalt, chromium, or an alloy containing the same by electroplating. Particularly, a nickel or cobalt alloy containing phosphorus is desirable.

Preferably, a surface roughness of the surface on which at least the roughening treating layer is formed of the high conductivity substrate is not more than 3.5 μm in terms of Rz. If too rough, the resistance coating will also be etched at the time of etching the conductive substrate and variations in resistance will be caused.

According to a second aspect of the invention, there is provided a resistance board comprising a high conductivity substrate on the surface of which a roughening treating layer by resistance components is provided and over the roughening treating layer of which a resistance layer is provided to form a conductive substrate with a resistance layer and an insulating board on at least one surface of which the resistance layer of the conductive substrate with the resistance layer is adhered.

According to a third aspect of the invention, there is provided a resistance circuit board comprising a high conductivity substrate on the surface of which a roughening treating layer by resistance components is provided and over the roughening treating layer of which a resistance layer is provided to form a conductive substrate with a resistance layer and an insulating board on at least one surface of which the resistance layer of the conductive substrate with the resistance layer is adhered to form a resistance board, the high conductivity substrate of the resistance board etched away to form a circuit comprising the resistance layer.

BRIEF DESCRIPTION OF THE DRAWING

The present invention will become more fully understood from the detailed description given hereinbelow and the accompanying drawing, which is given by way of illustration only, and thus is not limitative of the present invention, and wherein.

DESCRIPTION OF THE PREFERRED EMBODIMENTS

Figure 1:
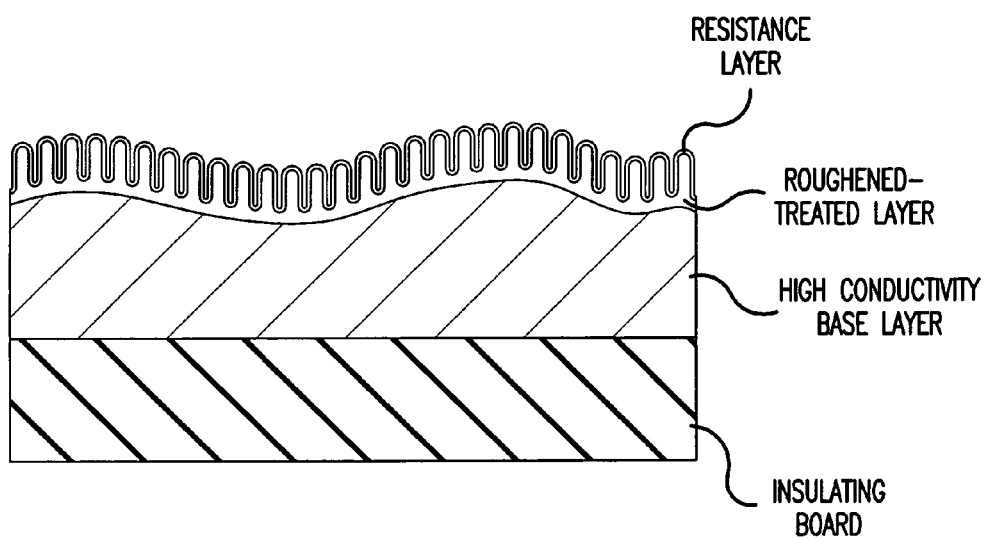
FIG. 1 is a cross-sectional view of a conductive substrate and resistance circuit board in accordance with an embodiment of the present invention.

The present invention first performs roughening treatment of the high conductivity substrate by the resistance components. Next, it plates the resistance components for a resistance layer to form a conductive substrate with a resistance layer.

In the present invention, for example the roughening treatment can be performed by a bath obtained by adding phosphorus to a nickel sulfate bath such as shown below.

Example of roughening plating bath

| | |
|---|---|
| $NiSO_4 \cdot 6H_2O$: | 200 g/liter |
| $H_2NaPO_4$: | 50 g/liter |
| $H_2NaPO_3$: | 40 g/liter |
| $NH_4Cl$: | 50 g/liter |
| Bath temperature: | 50° C. |
| pH: | 6 |
| Current density: | 80 A/dm$^2$ |

Note that it is also possible to use any other bath for roughening treatment by resistance components. As other examples, a sulfamic acid bath, pyrophosphoric acid bath, etc. are possible. Further, cobalt, copper, or other additional components may be included.

As the roughening treating layer, in addition to the above nickel alloy, a cobalt alloy or chromium alloy is also suitable. It is possible to form a roughening treating layer at a high current density in a bath for the later mentioned resistance layer.

An example of the plating bath and plating conditions for plating a resistance layer on the roughening treating layer in the present invention is given next:

| | |
|---|---|
| $NiSO_4 \cdot 6H_2O$: | 150 g/liter |
| $NiCl_2 \cdot 6H_2O$: | 45 g/liter |
| $NiCO_3$: | 15 g/liter |
| $H_3PO_4$: | 50 g/liter |
| $H_3PO_3$: | 40 g/liter |
| Bath temperature: | 75° C. |
| Current density: | 5 A/dm$^2$ |

Note that the current density for forming the resistance layer by flattening plating should be 1 to 30 A/dm$^2$. If over this, a drop in the current efficiency and deterioration of the flatness easily occurs.

In the same way as the formation of the roughened layer, this may of course also be performed by another bath or other conditions. It is also possible to form the layer by electroless plating in addition to electroplating. Further, vapor deposition or another dry formation is also available.

As another nickel alloy, there is nickel-iron-phosphorus alloy plating in a bath containing nickel sulfate, ferrous sulfate, sodium hypophosphite, boric acid, and sodium chloride.

As the resistance layer, a cobalt or chromium alloy is suitable in addition to the above nickel alloy. For the formation of the resistance layer, as the cobalt alloy bath, it is possible to use a bath containing cobalt sulfate, cobalt chloride, boric acid, and phosphoric acid, while as the chromium alloy bath, it is possible to use a bath containing anhydrous chromic acid, sulfuric acid, and hypophosphoric acid.

As the anode, it is possible to use a nickel or a nickel-phosphorus alloy or other soluble anode. However, a soluble anode is dissolved and consumed with long term plating and therefore the distance from the cathode (high conductivity substrate) changes resulting in the macro plating thickness distribution deteriorating. Further, the concentration of nickel in the bath increases due to the difference of the current efficiency between the anode and cathode, so the solution has to be drained and therefore the cost rises. Due to these reasons, use of an insoluble anode is preferred. Note that if using an insoluble anode, the nickel in the plating bath is reduced, so it is necessary to replenish the nickel. For this, it is preferable to add some nickel salts as nickel carbonate.

In the case of nickel-phosphorus, the resistance layer formed gives a high resistance and is good in etchability with a phosphorus content of 2 to 30 wt %. In particular, if 8 to 18 wt %, the resistance and etchability become further stable and there is little variation in resistance due to dissolution after etching the high conductivity substrate (for example, copper foil). The thickness should be in the range of 1 nm to 1000 nm. It is possible to adjust the concentration of phosphorus and the thickness of the layer to obtain the desired resistance value.

Further, as alloy components other than nickel and phosphorus, it is also possible to include copper, cobalt, and other elements. Further, in addition to nickel alloys, cobalt alloy, chromium alloy, and other alloys may be plated.

Note that after forming the resistance layer, the surface may be suitably treated by zinc plating, chromate treatment, silane treatment, etc.

Further, if the surface of the high conductivity substrate before the roughening treatment is too rough, the interface between the roughening treating layer formed over it and the resistance layer will also become rough, the nickel-phosphorus layer will be also dissolved at the time of dissolving away the high conductivity substrate, and the thickness of the resistance layer will easily fluctuate. In extreme cases, electrical connection will become impossible. Therefore, the surface roughness of the high conductivity substrate before roughening is preferably not more than 3.5 μm in terms of Rz, in particular is preferably not more than 2.5 μm in view of processability.

One embodiment of the method of production of a resistance board according to the present invention is given next.

First, a high conductivity substrate, for example, copper foil, is covered over one entire surface by a masking use adhesive sheet or ink etc. Next, the other surface is roughening treated by the above nickel-phosphorus alloy plating, then the above nickel-phosphorus alloy plating layer is formed as a resistance layer. Next, the masking use adhesive sheet etc. is peeled off and an insulating board is adhered to the resistance layer side by hot pressing, an adhesive, etc.

A printed resistance circuit board is formed from this resistance board by for example using the dissolution method to form insulating regions (where all of the resistance layer and high conductivity substrate on the insulating board are dissolved away), resistance regions (where the high conductivity substrate is dissolved away), and conductor regions (everything left). After formation of the circuit, according to need, the resistance regions and the conductor regions are covered with a liquid or film-like cover coat.

In the above processing, it is possible to use a known etching solution. For example, when the high conductivity substrate is copper foil, ferric chloride, cupric chloride, ammonium persulfate, a chromic acid-sulfuric acid mixture, an ammonia chelate-based etching solution, etc. may be used.

As the etching solution of the resistance layer in the case where the roughening treating layer and resistance layer are a nickel alloy such as nickel-phosphorus, a known etching solution such as a copper sulfate-sulfuric acid solution, a ferric sulfate-sulfuric acid solution, or an ammonium persulfate-sulfuric acid solution may be used. For etching of a resistance layer comprised of a cobalt or chromium alloy layer, a mixed bath of copper chloride and hydrochloric acid, a mixed bath of chromic acid and sulfuric acid, etc. may be used.

As the high conductivity material forming the conductive substrate with a resistance layer of the present invention, a foil having a high conductivity such as electrodeposited or rolled copper foil or copper alloy foil, aluminum foil, aluminum alloy foil, iron alloy foil, etc. is preferable. From the viewpoints of etching and recycling, a copper or copper alloy foil is best.

As the insulating board, epoxy resin, polyester, polyimide, polyamidimide, and composites of these with glass cloth, phenol resin-paper, epoxy resin-paper, or other laminates, sheets, films, etc. may be used.

Further, the above various insulating laminates, sheets, or films adhered to aluminum or iron sheets as heat sinks (adhered to the opposite surface for providing resistance layer) may be used.

Further, as the insulating board, ceramic boards, glass boards, and other inorganic materials using epoxy resin, polyester, polyurethane, polyamidimide, polyimide, and rubber or other resins or rubbers as binder layers may be used.

In the above explanation, for simplification, the explanation was given relating to a structure using a resistance layer having nickel-phosphorus as resistance components and adhered to one surface of an insulating board a resistance layer, roughening treating layer, and high conductivity substrate, but the resistance circuit substrate according to the present invention can be improved and modified structurally. For example, it also includes a structure comprised of an insulating board on both surfaces of which a resistance layer, roughening treating layer, and high conductivity substrate are adhered or a structure comprised of an insulating board on one surface of which a resistance layer, roughening treating layer, and high conductivity substrate are adhered and on the other surface of which a high conductivity layer (etched to form conductors and/or electrodes) is adhered.

The above explanation was made with the object of generally explaining the present invention and has no limitative significance at all. The scope of the present invention will best be understood by referring to the claims.

The present invention relates to a resistance board and a conductive substrate with a resistance layer to be adhered to an insulating board forming that resistance board and to a method of forming a resistance layer on the surface of the high conductivity substrate forming that conductive substrate with a resistance layer. In general, a printed resistance circuit board includes three layers of an insulating board, a resistance layer, and a conductive layer, but boards with more than three layers are also included in the present invention. Further, of course a resistance board material obtained by stacking a number of these is also included.

Below, the present invention will be explained in more detail by examples.

EXAMPLES

The following high conductivity substrate was pretreated by immersion in a 1:1 hydrochloric acid (35%) aqueous solution at ordinary temperature for 3 minutes, then was roughening treated, then plated with a resistance layer to prepare a conductive substrate with a resistance layer. This substrate was adhered to an insulating board, etched to form a resistance circuit, then measured for resistance at 1 mm square.

The peel strength with the insulating board was measured by the method set forth in JIS C 6481 5.7.3.

The results are shown in Table 1. Note that the pH of the electroplating bath was adjusted using sulfuric acid or sulfamic acid and NaOH.

Example 1

Electrodeposited copper foil before roughening treatment of a thickness of 18 μm and an Rz of the matte side of 2.1 μm was used as the high conductivity substrate. It was masked over its entire shiny side and leaving 10×10 cm² exposed at the matte side. Using as the anode a platinum plated titanium plate having a surface area of 1.5 dm², the matte side was roughening treated in the following bath and then a resistance layer was plated:

Roughening treatment conditions

| | |
|---|---|
| $NiSO_4 \cdot 6H_2O$: | 200 g/liter |
| $H_2NaPO_4$: | 50 g/liter |
| $H_2NaPO_3$: | 40 g/liter |
| $NH_4Cl$: | 50 g/liter |
| Bath temperature: | 50° C. |
| pH: | 6 |
| Current density: | 80 A/dm² |
| Time: | 10 sec |

Resistance layer plating conditions

| | |
|---|---|
| Nickel sulfamate: | 350 g/liter |
| $H_3BO_3$: | 35 g/liter |
| $H_3PO_4$: | 50 g/liter |
| $H_3PO_3$: | 40 g/liter |
| pH: | 1.0 |
| Bath temperature: | 65° C. |
| Current density: | 15 A/dm² |
| Time: | 30 sec |

Example 2

The same procedure was followed as in Example 1 to perform roughening treating, then plate a substrate with a resistance layer except for using rolled copper foil having an Rz of 1.8 μm.

Example 3

The same procedure was followed as in Example 1 to perform a roughening treating of a substrate, then the substrate was plated with a resistance layer at 90° C. to 20 nm in an electroless plating bath of a composition of 15 g/liter of cobalt sulfate, 20 g/liter of sodium hypophosphite, 120 g/liter of sodium tartarate, and 65 g/liter of ammonium sulfate to which ammonia was added to adjust the pH to 10.

Example 4

A substrate was roughening treated by the same bath as in Example 1, then was plated with a resistance layer by the following bath:

| | |
|---|---|
| Nickel sulfamate: | 450 g/liter |
| Cobalt sulfamate: | 50 g/liter |
| $H_3PO_2$: | 50 g/liter |
| Bath temperature: | 30° C. |
| Current density: | 10 A/dm² |
| Time: | 12 sec |
| pH: | 4.0 |

Example 5

A substrate was roughening treated by the same bath as in Example 1, then was plated with a resistance layer by the following bath:

| | |
|---|---|
| Nickel sulfamate: | 350 g/liter |
| Copper sulfamate: | 50 g/liter |
| $NaH_2PO_4$: | 50 g/liter |
| $H_3PO_3$: | 120 g/liter |
| Bath temperature: | 60° C. |
| Current density: | 1 A/dm² |
| Time: | 180 sec |
| pH: | 1.4 |

Comparative Example 1

A high conductivity substrate comprised of an electrodeposited copper foil of a thickness of 18 μm was roughening treated by copper to prepare a matte side with an Rz of 4.1 μm. The matte side was masked leaving 10×10 cm² exposed. Note that the shiny side was also masked completely. Using as the anode a platinum plated titanium plate having a surface area of 1.5 dm², a flat resistance layer was plated on the matte side under the same conditions as in Example 1.

Comparative Example 2

A high conductivity substrate comprised of a rolled copper foil of a thickness of 18 μm was roughening treated by copper on one surface to prepare a matte side with an Rz of 2.7 μm. The roughening treated surface was masked leaving 10×10 cm² exposed. Using as the anode a platinum plated titanium plate having a surface area of 1.5 dm², a resistance layer was plated on the roughening treated surface in the same way as Example 2.

Comparative Example 3

The same procedure was followed as in Comparative Example 1 other than not performing the roughening treatment.

The results are shown in the following Table 1. In Table 1, the peel strength is the average value of N=3.

The copper foil was etched by overlaying the plating resistance layer side of the resistance circuit board material prepared in the examples and comparative examples with epoxy-resin impregnated glass cloth, hot pressing this by a lamination press to adhere them and thereby prepare a printed circuit board with a resistance layer, then etched by Shipley Neutral-Etch V-1 at 52° C. until the copper color could no longer be visible (about 1 to 2 minutes). The resistance layer was etched away by 250 g/liter of copper sulfate, 5 ml/liter of sulfuric acid, and a copper chloride etching solution at 90° C.

TABLE 1

| Sample | Average resistance N = 20 (Ω/□) | 3σ resistance (Ω/□) | Peel strength (kN/m) |
|---|---|---|---|
| Ex. 1 | 50 | 3.0 | 1.15 |
| Ex. 2 | 53 | 3.2 | 1.06 |
| Ex. 3 | 75 | 3.5 | 1.14 |
| Ex. 4 | 28 | 3.2 | 1.16 |

TABLE 1-continued

| Sample | Average resistance N = 20 (Ω/□) | 3σ resistance (Ω/□) | Peel strength (kN/m) |
|---|---|---|---|
| Ex. 5 | 75 | 4.2 | 1.16 |
| Comp. Ex. 1 | 62 | 25 | 1.10 |
| Comp. Ex. 2 | 57 | 17 | 1.05 |
| Comp. Ex. 3 | 51 | 2.8 | 0.35 |

As clear from Table 1, the variation in resistance was small in the examples of the invention, but was large in both Comparative Examples 1 and 2.

Further, in Comparative Example 3, the peel strength was very inferior and peeling easily occurred, so it was not practical.

As clear from the above results, the present invention can provide a conductive substrate with a resistance layer which is small in variation of resistance value while maintaining the peel strength with the insulating board.

Summarizing the effects of the invention, as explained above, the conductive substrate with a resistance layer of the present invention comprises a high conductivity substrate provided on its surface with resistance component layers (roughening treating layer+resistance layer) in a manner giving a substantially flat interface, features small variation in resistance while maintaining the peel strength with the insulating board, and is provided with the resistance layer by the resistance components, so has the superior effect that even when dissolving away the high conductivity substrate, a thin film resistance layer can be formed stably with no danger of breaks in the resistance layer. The conductive substrate with a resistance layer can be used to fabricate a resistance board and that resistance board can be used to prepare a resistance circuit board.

While the invention has been described with reference to specific embodiments chosen for purpose of illustration, it should be apparent that numerous modifications could be made thereto by those skilled in the art without departing from the basic concept and scope of the invention.

The invention claimed is:

1. A conductive substrate comprising:
a high electrical conductivity substrate surface where said substrate is roughened-treated using resistance components to form a roughened-treated surface layer thereon; and
a resistance layer provided over the roughened-treated surface layer of the high conductivity substrate surface, said resistance layer and said roughened-treated surface layer forming resistance component layers,
wherein said resistance layer includes at least the same said resistance components used in the roughened-treated surface layer to enable an interface between said resistance component layers and said substrate to be formed substantially flat without an occurrence of incomplete dissolution of said substrate and to have said dissolution stopped at said roughened-treated surface layer to maintain a peel strength.

2. The conductive substrate as set forth in claim 1, wherein said high conductivity substrate surface is one of the group of an electrodeposited copper foil, electrodeposited copper alloy foil, rolled copper foil, and rolled copper alloy foil.

3. The conductive substrate as set forth in claim 1, wherein said resistance layer is formed by plating one of the group of nickel, cobalt, chromium, and alloys including the same by one of electroplating and electroless plating.

4. The conductive substrate as set forth in claim 1, wherein said resistance layer is one of the group of a nickel, cobalt, and chromium alloy containing at least phosphorus.

5. The conductive substrate as set forth in claim 1, wherein said roughened-treated layer is formed by a metal capable of being removed by the same etching solution as the resistance layer.

6. The conductive substrate as set forth in claim 1, wherein said roughened-treated layer is formed by plating one of the group of nickel, cobalt, chromium, and alloys including the same by one of electroplating and electroless plating.

7. The conductive substrate as set forth in claim 1, wherein said roughened-treated layer is one of the group of a nickel, cobalt, and chromium alloys containing at least phosphorus.

8. The conductive substrate as set forth in claim 1, wherein a surface roughness of the surface on which at least the roughened-treated layer is formed of the high conductivity substrate is not more than 3.5 µm in terms of Rz.

9. A resistance board comprising:
a high electrical conductivity substrate having on its surface a roughened-treated surface layer using a resistance component; and
a resistance layer provided over the roughened-treated surface layer of the high conductivity substrate, said resistance layer and said roughened-treated surface layer forming resistance component layers; and
an insulating board on at least one surface of which said resistance layer of said conductive substrate with said resistance layer is adhered,
wherein said resistance layer includes at least the same said resistance component used in the roughened-treated surface layer to enable an interface between said resistance component layers and said substrate to be formed substantially flat without an occurrence of incomplete dissolution of said substrate and to have said dissolution stopped at said roughened-treated surface layer to maintain a peel strength.

10. A resistance circuit board comprising:
a high electrical conductivity substrate having on its surface a roughened-treated using a resistance component; and
a resistance layer provided over the roughened-treated surface layer of the high conductivity substrate, said resistance layer and said roughened-treated surface layer forming resistance component layers; and
an insulating board on at least one surface of which said resistance layer of said conductive substrate surface with said resistance layer is bonded to form a resistance board,
said high conductivity substrate of the resistance board being etched away to form a circuit comprising the resistance layer,
wherein said resistance layer includes at least the same said resistance component used in the roughened-treated surface layer to enable an interface between said resistance component layers and said substrate to be formed substantially flat without an occurrence of incomplete dissolution of said substrate and to have said dissolution stopped at said roughened-treated surface layer to maintain a peel strength.

* * * * *